United States Patent [19]

Staley, Jr.

[11] Patent Number: 4,728,898

[45] Date of Patent: Mar. 1, 1988

[54] METHOD AND APPARATUS FOR DETECTING AND LOCATING FAULTS IN AN AC TRANSMISSION LINE USING TWO INDICATORS

[75] Inventor: Royce E. Staley, Jr.; Little Rock, Ark.

[73] Assignee: Staley Electric Co., Inc., Little Rock, Ark.

[21] Appl. No.: 840,001

[22] Filed: Mar. 17, 1986

[51] Int. Cl.$^4$ .................. G01R 31/08; G08B 23/00
[52] U.S. Cl. ..................... 324/522; 324/133; 340/550; 340/552; 364/483
[58] Field of Search .............. 324/51, 52, 133, 126, 324/127, 508, 512, 522–525, 539, 542, 555, 556; 340/650, 651, 652, 660, 661, 663; 361/42, 45, 46, 49, 50, 79, 65, 66, 88, 93; 364/483, 492

[56] References Cited

U.S. PATENT DOCUMENTS

| | | | |
|---|---|---|---|
| 3,838,339 | 9/1974 | Brandt | 324/133 |
| 3,911,360 | 10/1975 | Kimzey | 324/133 |
| 3,982,158 | 9/1976 | Knauer | 317/9 |
| 3,986,115 | 10/1976 | Huang | 324/133 X |
| 3,986,116 | 10/1976 | Smith et al. | 324/133 X |
| 4,179,651 | 12/1979 | Vitins | 324/51 |
| 4,208,627 | 6/1980 | Ebert, Jr. | 324/51 X |
| 4,253,056 | 2/1981 | Chaudhary | 324/51 |
| 4,334,188 | 6/1982 | Dudley | 324/133 |
| 4,488,110 | 12/1984 | Shirey et al. | 324/133 |
| 4,514,619 | 4/1985 | Kugelman | 364/483 X |
| 4,559,491 | 12/1985 | Saha | 324/552 |
| 4,562,401 | 12/1985 | Ziegler | 340/652 X |
| 4,618,933 | 10/1987 | Vitins | 364/483 X |

OTHER PUBLICATIONS

The Radio Amateur's Handbook, American Radio Relay League 1977, p. 584.

Primary Examiner—Reinhard J. Eisenzopf
Assistant Examiner—Jack B. Harvey
Attorney, Agent, or Firm—Nixon & Vanderhye

[57] ABSTRACT

A low-cost transmission line fault detector visually indicates the nature and location of transmission line failures. A current detection circuit inductively coupled to the transmission line produces an output signal when current is flowing through the line. A voltage detection circuit directly coupled across the transmission line monitors the relative potential across the line and produces an output signal when the relative potential is within predefined limits. By observing the states of the outputs of the current and voltage detection circuits (e.g., through visual indications provided by light emitting diodes), one can tell if the transmission line has shorted or open-circuited, and if it has, the location of the failure (e.g., between the source and the detector coupling point or between the detector coupling point and the load).

10 Claims, 1 Drawing Figure ered to monitor an RF transmission line because the standing wave ratio measuring circuit would draw off RF energy from the transmission line and degrade RF transmission performance.

METHOD AND APPARATUS FOR DETECTING AND LOCATING FAULTS IN AN AC TRANSMISSION LINE USING TWO INDICATORS

FIELD OF THE INVENTION

The invention relates to detection of faults (e.g., short-circuits and open-circuits) occurring in a transmission line connecting an AC signal source to a load.

BACKGROUND OF THE INVENTION

Alternating current (AC) signals are commonly transmitted between a signal source and a load via a transmission line having two or more conductors. Transmission lines provide an inexpensive means of carrying relatively high currents across distances with relatively low loss.

A transmission line has a number of different failure modes which can prevent the signal produced by the source from reaching the load and/or can damage the source. For example, suppose a two-conductor transmission line is used to connect a source of alternating current to a load. If one or both conductors becomes disconnected from the source or the load, no signal produced by the source reaches the load. This type of fault is usually relatively easy to diagnose, since it occurs at a point in the transmission system where faults are expected and where the transmission line is easily accessible (e.g., at a connector connecting the source to the transmission line or at a connector connecting the transmission line to the load).

It is far more difficult to diagnose problems compromising the integrity of the transmission line itself (e.g., short-circuits between the conductors of the transmission line, and discontinuity or breakage of one or more conductors). These types of faults are often diagnosed by visually inspecting the transmission line, a time-consuming and often unreliable method of fault detection. Hence, transmission lines are usually simply replaced if the transmission line terminations seem to be fault-free and the transmission system nevertheless does not work properly.

Additionally, it is often difficult to determine whether a transmission line has failed and, if it has, whether the failure might result in damage to the signal source. A short-circuited transmission line may draw excessive current from the signal source and damage the source. Even signal sources having output protection (e.g., current limiting or the like) typically simply shut down without indicating to a user that the transmission line has failed or how it has failed.

DC resistance measurements can sometimes be used to determine how a transmission line has failed. Unfortunately, such measurements generally cannot be performed when a signal is present on the transmission line. Disconnection of the transmission line from the signal source or the load interrupts transmission service and increases system down time. Intermittent faults present particular difficulties, since resistance measurements cannot be performed continuously while the transmission line is carrying a signal, and yet, taking the line out of service to test it may not demonstrate a fault exists. Moreover, failure of the transmission line in a manner which changes its AC impedance but not its DC resistance cannot be detected by DC resistance measurements and yet can degrade transmission line performance. Resistance measurements are therefore not an entirely accurate method of detecting all faults in AC systems.

The prior-issued United States patents listed below disclose representative fault and signal detection circuits which may be relevant to the present invention:

| Chaudhary | 4,253,056 | 1981 |
| Shirey et al | 4,488,110 | 1984 |
| Brandt | 3,838,339 | 1974 |
| Vitins | 4,179,651 | 1979 |
| Dudley | 4,334,188 | 1982 |
| Ebert, Jr. | 4,208,627 | 1980 |
| Knauer | 3,982,158 | 1976 |
| Kimzey | 3,911,360 | 1975. |

Some of the patents listed above disclose DC voltage detectors which can be continuously connected to the DC voltage to be monitored. For example, the Chaudhary patent discloses a detector circuit including a voltage comparator, voltage dividers and diodes. Chaudhary's circuit can be continuously coupled to a DC power supply output to detect an unwanted ground coupled to either terminal of the power supply. Shirey et al discloses a DC voltage monitoring circuit which illuminates a green LED when the monitored DC voltage exceeds a predetermined reference voltage, and illuminates a red LED when the DC voltage is less than the reference voltage.

The Brandt patent teaches a digital signal test circuit for detecting low, high and open voltage levels, as well as current levels indicative of an open-circuit condition. Indicators associated with each of the detectors include light emitting diodes (LEDS).

Vitins shows a system for detecting short circuits in an electrical line by utilizing both current and voltage signals. The current and voltage signals are weighted relative to one another, an amplitude comparision is ultimately carried out, and short circuits are also detected.

Dudley shows (in FIG. 8b) circuitry including a light emitting diode which can detect open circuits. Ebert, Jr. teaches a simple circuit for detecting shorting of a periodic signal source. The Knauer patent teaches a power distribution control system which compares actual line current to simulated fault current when the line current exceeds a predetermined threshold level.

Kimzey teaches a voltage monitoring system using a flip-flop and an LED which provide an indication that the monitored voltage has fallen to below a threshold and maintain the indication of failure after the voltage has returned to its normal level.

A further reference, *The Radio Amateur's Handbook* (American Radio Relay League, 54th ed.), discloses a transmatch circuit at page 584 which includes a standing wave ratio measuring circuit inductively coupled to an RF transmission line. The standing wave ratio measuring circuit provides an analog indication (on an ammeter) of the amplitude of current flowing through the transmission line.

Although complex fault detectors have their purposes, a simple and inexpensive AC transmission line fault detector which can be continuously coupled to a transmission line without degrading AC signal transmission and which can indicate when the transmission line has failed and how it has failed would be highly desirable.

SUMMARY OF THE INVENTION

The present invention provides method and apparatus for continuously monitoring the condition of an AC transmission line and indicating when and how the transmission line has failed.

The current and voltage carried at a selected point along a transmission line of the type having two conductors connecting an AC source to a load are sensed and analyzed. Signals generated in response to the sensed current and voltage may be used to drive first and second discrete visual indicators.

The indicators are both illuminated when the source is delivering a signal to the transmission line and the line is not open or shorted. The first indicator is illuminated and the second indicator is darkened when at least one of the conductors of the line is discontinuous (open) between the selected point and the load. The first indicator is darkened and the second indicator is illuminated when the conductors are shorted together at a point along the line between the selected point and the load. Both indicators are darkened whenever: (1) the source is not delivering a signal to the load, (2) the conductors are shorted together at a point along the line between the source and the selected point, or (3) at least one of the conductors is open (discontinuous) between the source and the selected point.

In accordance with a further aspect of the invention, a voltage proportional to a sensed voltage differential between two conductors of a transmission line is connected across a resistor. A fixed voltage drop is also induced across the resistor. A comparator connected across the resistor produces an output signal when voltage proportional to the sensed voltage differential exceeds and is opposite in polarity to the fixed voltage drop.

In accordance with yet another feature of the invention, a coil adapted to inductively couple to the transmission line produces, at an output terminal thereof, a signal level proportional to the amplitude of the current flowing through the transmission line. A resistor is connected between the coil output terminal and ground terminal. A predetermined reference level is applied to one input of a comparator circuit. Another input of the comparator circuit is connected to the coil output terminal. The comparator circuit produces an output whenever a predetermined relationship exists between the signal level produced by the coil and the reference level.

In accordance with yet another feature of the invention, a first resistor is connected at one end to ground potential. A second resistor is connected at one end to the other end of the first resistor and at its other end to a third resistor. The end of the third resistor not connected to the second resistor is connected to a fixed supply voltage. A fourth resistor is connected between a first conductor of the transmission line and the second resistor one end. A fifth resistor is connected between a second conductor of the transmission line and the second resistor other end. A further comparator circuit has a first input terminal connected to the second resistor one end and has a second input terminal connected to the second resistor other end. The further comparator circuit produces an output signal whenever the voltage present on the first conductor exceeds the voltage present on the second conductor by a predetermined voltage.

The present invention can be practiced using only a few inexpensive component parts (e.g., comparators, resistors and light emitting diodes) and yet is capable of indicating that a transmission system has failed, the nature of the failure, and the relative location of the failure. If desired, a transmission line may be continuously monitored using detection techniques of the present invention without degrading signal transmission quality. For example, the detector of the present invention may be permanently connected to a transmission line so that transmission line failure can be detected as soon as it occurs. Because the present invention provides fault detection at low cost using commonly-available components, transmission line fault detection can now be provided in circumstances which might not warrant the expense of prior-art fault detection systems.

BRIEF DESCRIPTION OF THE DRAWINGS

These and other features and advantages of the present invention can be better appreciated and more completely understood by referring to the following detailed description of preferred embodiments together with the appended FIG. 1, which is a schematic diagram of a presently preferred exemplary embodiment of a transmission line condition detector in accordance with the present invention.

DETAILED DESCRIPTION OF PREFERRED EMBODIMENTS

Figure 1:
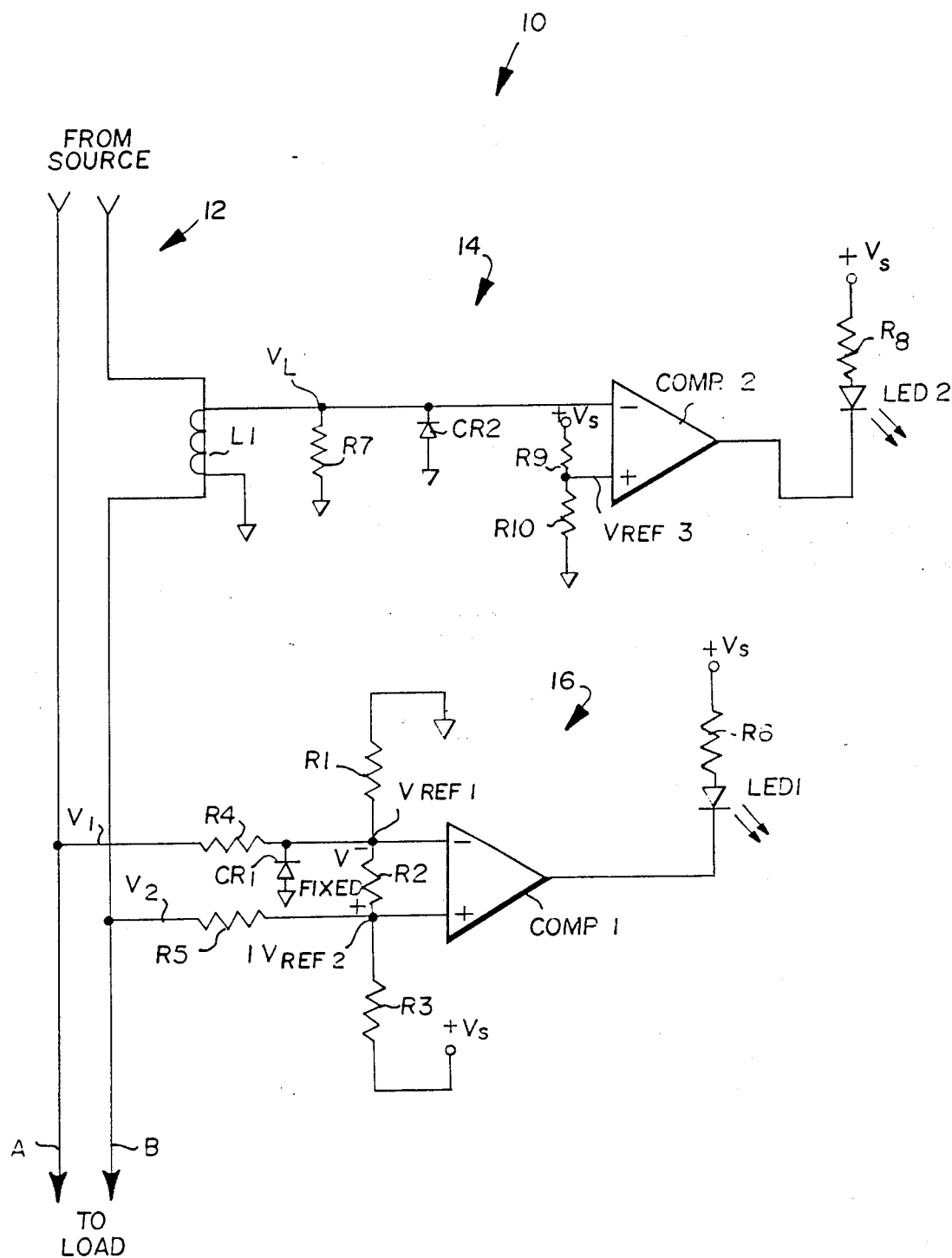

FIG. 1 is a schematic diagram of a presently preferred exemplary embodiment of an AC transmission line condition detector 10 in accordance with the present invention. Detector 10 may be used to monitor the condition of a transmission line 12 of the type including a first conductor A and a second conductor B electrically isolated from one another by an electrical insulator.

Transmission line 12 may be used to couple a source of alternating current signal to a load. For example, transmission line 12 might comprise a pair of heavy gauge conductors coupling an AC power generator to a motor or other load requiring substantial power, a pair of light gauge conductors coupling the output of an audio amplifier to an audio transducer, etc. Although the preferred embodiment might not be especially suitable for monitoring a VHF or UHF radio frequency transmission line (because of the losses which would be introduced), the present invention is useful with virtually any type of AC signal source, virtually any type of AC load, and virtually any type of transmission line 12.

Detector 10 includes two independent circuits in the preferred embodiment: a current detection circuit 14 and a voltage detection circuit 16. Current detection circuit 14 monitors the current flowing through transmission line 12 (by monitoring the current flowing through conductor B in the preferred embodiment) and produces a visual indication representing the sensed current. Voltage detection circuit 16 in the preferred embodiment is directly coupled to both of conductors A and B, and produces a further visual indication responsive to a sensed voltage differential existing between those conductors. The structure and operation of current detection circuit 14 and voltage detection circuit 16 will now be described in greater detail.

Voltage detection circuit 16 in the preferred embodiment includes resistors R1–R6, a comparator circuit COMP 1 and a light emitting diode LED 1. Resistor R1 is connected between the inverting input of comparator COMP 1 and ground potential (the preferred embodiment uses a floating ground potential tied to neither of conductors A and B to provide isolation between detector 10 and the signal being transmitted). A fixed power supply voltage $V_s$ (produced by a conventional low voltage power supply or battery not shown) is connected to the non-inverting input of comparator COMP 1 through a series resistor R3. A resistor R2 is connected between the inverting and non-inverting inputs of comparator COMP 1.

Resistors R1, R2 and R3 form a voltage divider network which applies fixed reference voltage $V_{ref1}$ to the inverting input of comparator COMP 1 and a higher reference voltage $V_{ref2}$ to the non-inverting input of the comparator. If the fixed voltage drop across resistor R2 is assumed to be a value $V_{fixed}$, then the following relation exists:

$$V_{fixed} = V_{ref2} - V_{ref1} \quad (1)$$

As will be understood, the absolute values of $V_{ref1}$ and $V_{ref2}$ are determined by the resistance of resistors R1, R2 and R3 and the voltage level $V_s$, while the voltage differential $V_{fixed}$ is determined by the difference between the levels $V_{ref1}$ and $V_{ref2}$.

One end of a resistor R4 is connected (directly coupled in the preferred embodiment) to conductor A of transmission line 12, the other end of this resistor being connected to the inverting input of comparator COMP 1 (and thus to the junction between resistors R1 and R2). Similarly, one end of resistor R5 is connected directly to conductor B of transmission line 12. The other end of this resistor R5 is connected to the non-inverting input of comparator COMP 1 (and thus to the junction of resistors R2 and R3).

Comparator COMP 1 in the preferred embodiment has an open collector output. In the preferred embodiment, the output of comparator COMP 1 is connected to the anode of light emitting diode LED 1. The cathode of light emitting diode LED 1 is connected through current-limiting resistor R6 to supply voltage $V_s$.

Light emitting diode LED 1 is turned on by comparator COMP 1 when the inverting input of the comparator rises to a potential higher than the potential present at the non-inverting input of the comparator. LED 1 is turned off by comparator COMP 1 when the non-inverting input of the comparator is at a higher level than the comparator inverting input.

Table I below sets forth the component values used in the preferred embodiment for voltage detection circuit 15.

TABLE I

| Component | Value |
|---|---|
| R1 | 100KΩ |
| R2 | 10KΩ |
| R3 | 100KΩ |
| R4 | 10KΩ |
| R5 | 10KΩ |
| R6 | 180Ω |

For the component values listed above and for $V_s = 5.0$ VDC, $V_{fixed} = 240$ millivolts, $V_{ref1} = 2.38$ volts, and $V_{ref2} = 2.62$ volts. The voltage $V_1$ (the voltage present on conductor A at the point the conductor is connected to resistor R4) and the voltage $V_2$ (the voltage present on conductor B at the point resistor R5 is connected to the conductor) are isolated from detector 10 in the preferred embodiment by the relatively high resistances of resistors R4 and R5, which provide a high impedance load preventing signal degradation.

The resistor network comprised of resistors R1, R2 and R3 acts as a biasing network which applies a fixed bias $V_{fixed}$ between the inverting and non-inverting inputs of comparator COMP 1. Thus, if voltage detector circuit 16 is disconnected from conductors A and B, the inverting input of comparator COMP 1 is biased to a fixed level $V_{ref1}$ which is lower (by the voltage differential $V_{fixed}$) than the fixed voltage $V_{ref2}$ present on the non-inverting input of the comparator. In this condition, the output of comparator COMP 1 is forced to its high impedance state and light emitting diode LED 1 is turned off. Comparator COMP 1 assumes this state whenever $V_1$ and/or $V_2$ is floating (e.g., if transmission line 12 is open between the source and the point at which voltage detection circuit 16 connects to it), and whenever $V_1$ less than or equal to $V_2$.

Because of the high resistances of resistors R4 and R5 in the preferred embodiment, very little current is drawn from conductors A and B regardless of the values of voltages $V_1$ and $V_2$ as compared to voltages $V_{ref1}$ and $V_{ref2}$, respectively. Neglecting the currents flowing through resistors R4 and R5. comparator COMP 1 turns light emitting diode LED 1 ON only when the following condition exists:

$$V_1 > V_2 + V_{fixed} \quad (2)$$

As $V_1$ goes positive with respect to $V_2$, the comparator output is driven low, providing a current path through light emitting diode LED 1 and current limiting resistor R6 to turn the light emitting diode on. When voltage $V_1$ goes negative with respect to voltage $V_2$, the comparator output changes to the open collector state, opening the current path and shutting off LED 1. Diode CR1 (connected between the inverting input of comparator COMP 1 and ground) is provided to prevent the negative input of the comparator from becoming more negative than a few tenths of a volt below ground potential to protect the comparator.

If the source connected to transmission line 12 is producing an alternating current signal, conductors A and B are not shorted to one another anywhere along the transmission line, and the conductors are continuous from at least the source to the point at which voltage detector circuit 16 connects to them, light emitting diode LED 1 turns on and off at the frequency and with the duty cycle of the alternating current signal produced by the source. Although LED 1 is off approximately 50 percent of the time (for AC signals having a 50% duty cycle), it appears to the eye to be on continuously so long as the frequency of the AC signal is high enough (e.g., 30 Hz or greater).

Voltage detection circuit 16 thus produces a visual indication (by illuminating LED 1) when an alternating voltage signal is detected across its differential inputs. LED 1 is extinguished if transmission line 12 is broken between the signal source and either of the inputs of voltage detection circuit 16. LED 1 is also extinguished if a short circuit exists anywhere along the transmission line, or if the signal source is not sending a signal.

If either conductor A or conductor B is broken (i.e., discontinuous) at any point between the source and the point at which voltage detection circuit 16 is coupled to transmission line 12 (e.g., if one of the conductors is broken, or the connection between the source and the conductor is bad), the biasing network comprising resistors R1, R2 and R3 forces the inverting input of comparator COMP 1 to have a potential below the potential present on the non-inverting input, and LED 1 is turned off. LED 1 is also darkened if conductors A and B are shorted together anywhere along transmission line 12, since the difference between $V_1$ and $V_2$ falls to less than $V_{fixed}$ whever this occurs.

Current detection circuit 14 will now be described in detail. Current detection circuit 14 includes coil L1, resistors R7, R8, R9 and R10, a diode CR2, a further comparator circuit COMP 2, and a further light emitting diode LED 2. Current detection circuit 14 operates independently of voltage detection circuit 16 in the preferred embodiment, although the indications produced by these two circuits can be used together to help pinpoint the location of a fault (as will be described).

Coil L1 is looped around one conductor of transmission line 12 (conductor B in the FIGURE) a sufficient number of turns to provide adequate coupling and resulting signal levels. Coil L1 and conductor B together act as a current sensing transformer. An alternating current is induced in coil L1 at a frequency equal to and at an amplitude proportional to the AC signal frequency and amplitude, respectively, flowing through conductor B. One side of coil L1 is connected to ground potential, and the other side is connected to one end of resistor R7. The other end of resistor R7 is connected to ground.

A voltage $V_L$ having a level proportional to the instantaneous current flowing through conductor B is produced at the junction of resistor R7 and coil L1. This voltage level $V_L$ is applied to the inverting input of comparator COMP 2. Diode CR2 is connected between the comparator inverting input and ground potential to protect the comparator, as previously described in connection with diode CR1.

One end of resistor R9 is connected to supply voltage $V_s$, the other end of this resistor being connected to an end of a resistor R10. The other end of resistor R10 is connected to ground. Resistor R9 and R10 form a voltage divider which produces a fixed voltage $V_{ref3}$ at the junction therebetween. Voltage $V_{ref3}$ is applied to the non-inverting input of comparator COMP 2. The output of comparator COMP 2 is connected to light emitting diode LED 2 and series resistor R8. Resistor R8 is connected to supply voltage $R_S$. Table II below lists the component values used for current detection circuit 14 in the preferred embodiment:

TABLE II

| Component | Value |
|---|---|
| R7 | 5KΩ |
| R8 | 180Ω |
| R9 | 10KΩ |
| R10 | 220Ω |

With the component values listed in Table II and $V_S = 5.0$ volts, $V_{ref3} = 110$ millivolts.

Voltage comparator COMP 2 is biased by resistors R9 and R10 to detect a small positive voltage at its inverting input. Coil L1 provides alternating voltage $V_L$ to the inverting input of comparator COMP 2 whenever alternating current of a sufficient amplitude is being transmitted through transmission line 12. The periodic signal voltage $V_L$ drives the output of comparator COMP 2 periodically between the open collector state and the high impedance state (at the frequency of the AC signal carried by the transmission line). Thus, LED 2 appears to be continuously on whenever transmission line 12 is carrying an AC signal of a sufficient frequency and amplitude.

When alternating current is not flowing through conductor B, no voltage is induced across resistor R7 and applied to the inverting input of comparator COMP 2, leaving the output of comparator in the open collector state and LED 2 turned off. LED 2 is darkened if either of conductor A and B are discontinuous anywhere between the source and the load; if either of the conductors is not connected to both the source and the load; or if conductors A and B are shorted together at a point along transmission line 12 between the source and the coupling point of coil L1. LED 2 is also off whenever the source is not supplying an AC signal to the transmission line.

In the preferred embodiment, the condition of transmission line 12 is indicated by a combination of an output signal produced by voltage detection circuit 16 (the state of this output signal is visually indicated in the preferred embodiment by the state of LED 1) and an output signal produced by current detection circuit 14 (the state of this output signal is visually indicated by the state of LED 2). This combination of indications is more valuable in diagnosing the nature and location of a fault than either indication would be if taken alone. Although circuits 14 and 16 provide overlapping detection coverage, both circuits together maximize fault detection accuracy and help to pinpoint the location of a fault. The manner in which the indications produced by light emitting diodes LED 1 and LED 2 can be used together to diagnose the nature and location of a fault will now be explained.

If LED 1 and LED 2 both appear to be ON, no fault is present in the transmission system. That is, the source is delivering a signal which is being received by the load, there are no short-circuits between conductors A and B, and conductors A and B are both continuous between the source and the load and are properly connected to both the source and the load. A fault condition exists if either or both of the LEDs is extinguished.

If LED 1 is ON and LED 2 is OFF, a fault exists in transmission line 12. This condition indicates that either conductor A or conductor B (or both) is discontinuous (broken) at some point along transmission line 12 between the point at which detector 10 is coupled to the transmission line and the point at which the transmission line is coupled to the load; the load has become disconnected from one (or both) of conductors A and B; or the load itself has open-circuited. When this fault condition is indicated, the load and its connection to transmission line 12 should be checked first. If the load is properly connected to the transmission line, then a break in one (or both) of conductors A and B between the point at which detector 10 is coupled to transmission line 12 and the point at which the transmission line is coupled to the load is indicated.

If LED 1 is OFF and LED 2 is ON, conductors A and B are shorted together (or an abnormally low AC impedance exists between them) somewhere between the point at which detector 10 is coupled to transmission line 12 and the point at which the transmission line is coupled to the load; or the load itself may be shorted. If this fault condition occurs, the load should be checked to ensure that it has the correct impedance. If the load impedance is correct, transmission line 12 should be inspected for shorts between the point at which detector 10 is coupled to the transmission line and the point at which the transmission line connects to the load.

If LED 1 and LED 2 are both OFF, a problem existing somewhere between the source and the point at which detector 10 is coupled to the transmission line is indicated. Disconnection of the source from transmission line 12 or failure of the source to apply a signal to the transmission line are conditions that can cause this indication to occur. Both light emitting diodes will also be OFF if there is a short-circuit (or abnormally low AC impedance) between conductors A and B at some point along transmission line 12 between the source and the point at which detector 10 is coupled to the transmission line Finally, a discontinuity (i.e., break) in one (or both) of conductors A and B at some point along transmission line 12 between the source and the coupling point of detector 10 can cause LED 1 and LED 2 to both be OFF While the preferred embodiment has been described with what is presently considered to be the most practical and preferred embodiments, it is to be understood that the appended claims are not to be limited to the disclosed embodiments, but on the contrary, are intended to cover all modifications, variations and/or equivalent arrangements which retain any of the novel features and advantages of this invention. By way of non-limiting example, although the preferred embodiment produces visual indications of the states of comparators COMP 2, LED 1 and LED 2 could be replaced with synchronizing registers/data transceivers if desired to permit the output signals generated by the comparators to be monitored by a digital signal processor.

What is claimed is:

1. Apparatus for providing a visual indication of whether a transmission line connecting an AC source to a load is open-circuited and/or short-circuited comprising:
   means disposed along said transmission line for sensing the current and voltage carried by said line;
   first and second discrete visual indicators; and
   control means, operatively coupled to said sensing means and said first and second visual indicators, for selectively illuminating said first and second visual indicators in response to said sensed current and voltage as follows:
   (a) illuminating both said first and second indicators when the source is delivering an AC signal to the line and the line is not open or shorted
   (b) illuminating said first indicator and darkening said second indicator when said line is discontinuous somewhere between the point along said line at which said sensing means is disposed and said load,
   (c) darkening said first indicator and illuminating said second indicator when said line is shorted somewhere between the point along said line at which said sensing means is disposed and said load, and
   (d) darkening both said first and second indicators whenever any one of the following conditions exist:
   (1) said source is not delivering a signal to said line
   (2) said line is shorted somewhere between said source and the point along said line line at which said sensing means is disposed, and
   (3) said line is discontinuous somewhere between the source and the point along said line at which said sensing means is disposed.

2. Apparatus as in claim 1 wherein said sensing means includes:
   coupling means, adapted to inductively couple to a conductor of said transmission line for producing a first signal representing the current flowing through said conductor; and
   direct coupling means, adapted to directly couple to said first-mentioned conductor and to a further conductor of said transmission line for producing a second signal representing the difference in the potentials present on said conductors.

3. An apparatus as in claim 1 wherein:
   said control means includes:
   a resistor and
   means for inducing a fixed voltage drop across said resistor;
   said sensing means includes means coupled to said transmission line for producing a voltage proportional to the difference in the potentials present on first and second conductors of said line and for connecting said difference voltage across said resistor; and
   said control means further includes comparator means connected across said resistor for producing a first output signal when the magnitude of the difference voltage produced by said voltage producing means exceeds said voltage drop and the polarity of the voltage produced by said producing means is opposite the polarity of said voltage drop.

4. An apparatus as in claim 3 wherein said voltage producing means comprises:
   a further resistor connecting said first conductor of said line to one end of said first-mentioned resistor; and
   a still further resistor connecting said second conductor of said line to the other end of first-mentioned resistor.

5. An apparatus as in claim 4 wherein said inducing means comprises:
   a terminal connected to receive a fixed DC level;
   a further resistor connected between said one end of said first-mentioned resistor and ground potential; and
   a still further resistor connected between said other end of said first-mentioned resistor and said terminal.

6. An apparatus as in claim 3 wherein said inducing means comprises:
   a terminal connected to receive a fixed DC level;
   a further resistor connected between one end of said first-mentioned resistor and ground potential; and
   a still further resistor connected between the other end of said first-mentioned resistor and said terminal.

7. An apparatus as in claim 3 wherein:
   said sensing means further includes coil means, adapted to inductively couple to said line, for producing at an output terminal thereof a signal level proportional to the amplitude of the current flowing through said line; and
   said control means further includes:
   a resistor connected between said coil means output terminal and ground potential
   means for producing a predetermined reference level, and a further comparator circuit having a first input terminal connected to said coil means output terminal and having a second input terminal connected to receive said reference level, for producing a second output signal whenever a predetermined relationship exists between the signal level produced by said coil means and the reference level.

8. An apparatus as in claim 1 wherein said control means includes:
   a first resistor connected at one end to ground potential;
   a second resistor connected at one end to another end of said first resistor;
   a third resistor connected at one end to a fixed voltage source and connected at another end to another end of said second resistor;
   a fourth resistor connected between a first conductor of said two-conductor line and said second resistor one end;
   a fifth resistor connected between a second conductor of said two-conductor line and said second resistor another end; and
   a comparator circuit, having a first input terminal connected to said second resistor one end and a second input terminal connected to said second resistor another end, for producing an output signal whenever the voltage present on said first conductor exceeds the voltage present on said second conductor by a predetermined bias voltage induced across said second resistor by current flowing from said fixed voltage source to ground potential through said first, second and third resistors.

9. Method of indicating whether a transmission line connecting a source to a load is open-circuited and/or short-circuited, comprising the steps of:
   illuminating both a first and a second discrete visual indicator when the source is delivering a signal to said transmission line and said line is not open or shorted;
   illuminating said first indicator and darkening said second indicator when said line is open somewhere between a preset point along said transmission line and said load;
   darkening said first indicator and illuminating said second indicator when said transmission line is shorted somewhere between said preset point and said load;
   darkening both said first and second indicators when said line is shorted somewhere between said source and said preset point; and
   darkening both said first and second indicators when said line is open somewhere between said source and said preset point.

10. In a transmission system of the type including an AC signal source, a load, and a transmission line connecting the load to the source, a fault detector comprising:
   detecting/indicating means for detecting open circuits and short-circuited in said transmission line; and
   coupling means for coupling said detecting/indicating means to said transmission line at a preset point along said line.
   said detecting/indicating means programmed to perform the following functions in response to the voltage and current carried by said transmission line;
   producing first and second output signals when the source is delivering a signal to said transmission line and said line is not open or shorted;
   producing said first signal but not said second signal when said line is open somewhere between said preset point and said load;
   producing said second signal but not said first signal when said line is shorted somewhere between said preset point and said load;
   producing neither said first nor said second signals when said line is shorted somewhere between said source and said preset point; and
   producing neither said first nor said second signals when said line is open somewhere between said source and said preset point.

* * * * *